(12) United States Patent
Matsumoto et al.

(10) Patent No.: US 11,646,271 B2
(45) Date of Patent: May 9, 2023

(54) APPARATUSES INCLUDING CONDUCTIVE STRUCTURE LAYOUTS

(71) Applicant: MICRON TECHNOLOGY, INC., Boise, ID (US)

(72) Inventors: Hirokazu Matsumoto, Tokyo (JP); Ryota Suzuki, Kanagawa (JP); Mitsuki Koda, Kanagawa (JP); Makoto Sato, Kanagawa (JP)

(73) Assignee: MICRON TECHNOLOGY, INC., Boise, ID (US)

( * ) Notice: Subject to any disclaimer, the term of this patent is extended or adjusted under 35 U.S.C. 154(b) by 156 days.

(21) Appl. No.: 17/301,758

(22) Filed: Apr. 13, 2021

(65) Prior Publication Data

US 2021/0233858 A1 Jul. 29, 2021

Related U.S. Application Data

(62) Division of application No. 16/590,571, filed on Oct. 2, 2019, now Pat. No. 11,004,798.

(51) Int. Cl.
*H01L 23/538* (2006.01)
*H01L 25/18* (2023.01)
*H01L 25/065* (2023.01)
*H01L 21/768* (2006.01)

(52) U.S. Cl.
CPC .... *H01L 23/5386* (2013.01); *H01L 21/76807* (2013.01); *H01L 23/5383* (2013.01); *H01L 25/0652* (2013.01); *H01L 25/18* (2013.01)

(58) Field of Classification Search
CPC ................... H01L 23/5386; H01L 23/5383
See application file for complete search history.

(56) References Cited

U.S. PATENT DOCUMENTS

| 9,761,564 | B1* | 9/2017 | Shibata | G11C 11/4091 |
| 11,004,798 | B2 | 5/2021 | Matsumoto et al. | |
| 2003/0209727 | A1 | 11/2003 | Ohayashi et al. | |
| 2015/0200074 | A1* | 7/2015 | Hamaguchi | H01J 37/3177 250/396 R |
| 2021/0104466 | A1 | 4/2021 | Matsumoto et al. | |

OTHER PUBLICATIONS

U.S. Appl. No. 16/590,571, titled "Apparatuses Including Conductive Structure Layouts", filed Oct. 2, 2019, pp. all.

* cited by examiner

*Primary Examiner* — Farun Lu
(74) *Attorney, Agent, or Firm* — Dorsey & Whitney LLP

(57) ABSTRACT

Embodiments of the disclosure are drawn to arrangements of one or more "cuts" or pattern of cuts in conductive structures. Wiring layers may each include a cut pattern including a set of cuts through conductive structures of the wiring layers where each of the cuts is offset from the other in a direction orthogonal to the cut. The cut pattern in a wiring layer may be orthogonal to the cut pattern in another wiring layer. In some examples, the cut pattern may be a stair-step pattern. In some examples, the cut pattern may be interrupted by other conductive structures.

18 Claims, 9 Drawing Sheets

US 11,646,271 B2

1

APPARATUSES INCLUDING CONDUCTIVE STRUCTURE LAYOUTS

CROSS REFERENCE TO RELATED APPLICATION(S)

This application is a divisional of U.S. patent application Ser. No. 16/590,571 filed Oct. 2, 2021 and issued as U.S. Pat. No. 11,004,798 on May 11, 2021. The aforementioned application, and issued parent, is incorporated herein by reference, in its entirety, for any purpose.

BACKGROUND

This disclosure relates generally to conductive structures (e.g., wires, wiring layers), and more specifically, to conductive structures in semiconductor devices. For example, conductive structures may be used in memory devices, including volatile memory, such as dynamic random access memory (DRAM). DRAM may be included in a high bandwidth memory (HBM). HBM may include a die (e.g., chip) stack with one or more core die and one or more interface (IF) die. Each core die may include one or more memory arrays made up of one or more memory cells. Memory cells and/or other structures in the core die and/or IF die may be coupled to one another by one or more conductive structures. For example, conductive structures may couple one or more memory cells to a voltage source.

DETAILED DESCRIPTION

Figure 1:
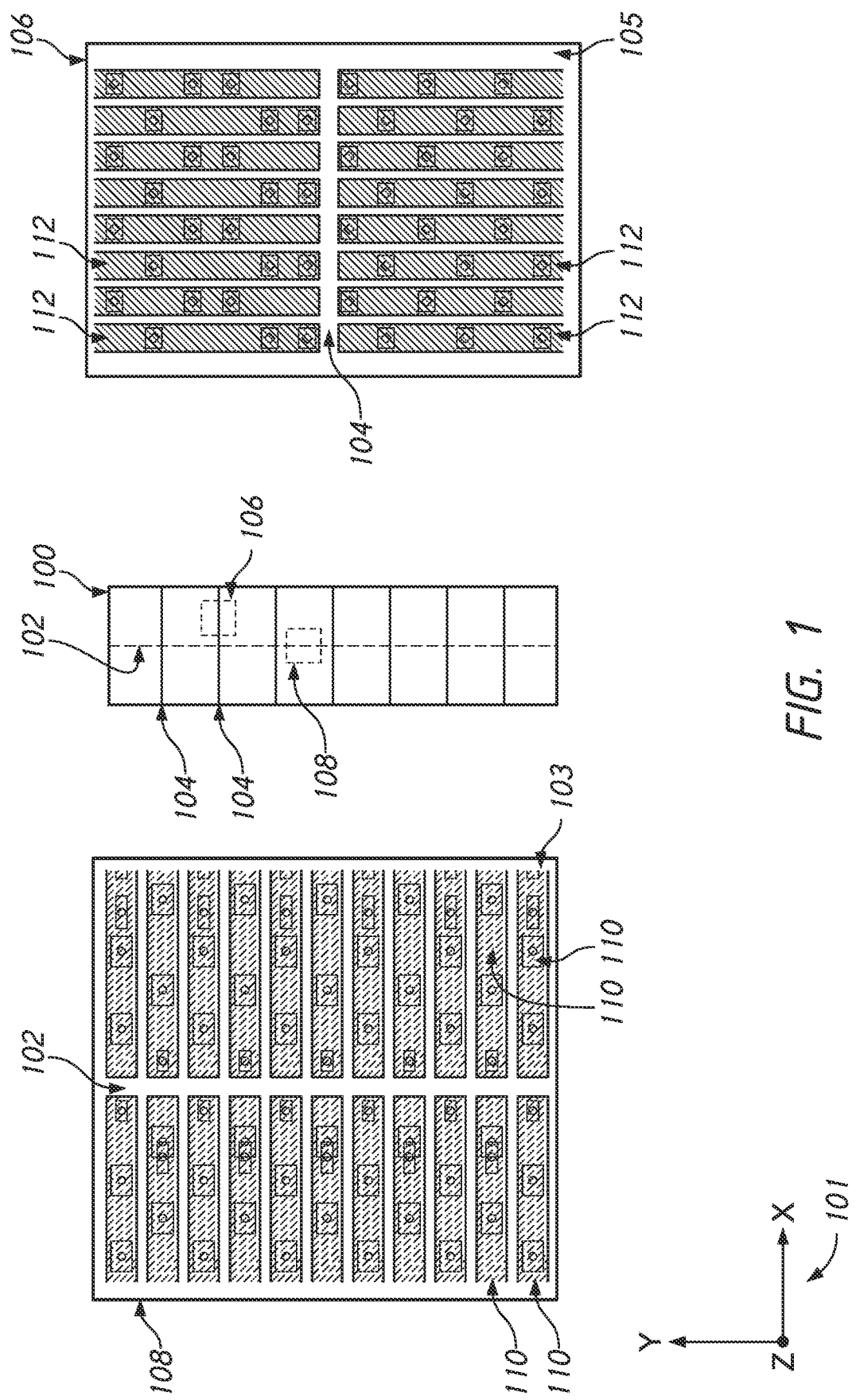
FIG. 1 is an illustration conductive structures in a semiconductor device.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Conductive structures may be used in a variety of semiconductor devices, for example, controllers and memories. Some conductive structures may be used for coupling two or more components. For example, an operational amplifier may be coupled to a power source by a conductive structure (e.g., wire). In order to couple components, the conductive structures may extend a distance across the device in some applications. Typically, devices include a significant number of conductive structures extending various distances across the device. In some devices, there may be multiple layers (e.g., metallization layers, wiring layers) of conductive structures, some of which may be coupled to one another by one or more vias. The conductive structures in a layer may be placed close together to save space. However, as the space between the conductive structures decreases, the risk of the conductive structures inadvertently touching one another and causing a short increases. Long lengths of the conductive structures may also increase the risk of short circuits.

In some applications, the lengths of conductive structures are limited to reduce the risk of short circuits. For example, conductive structures may not be permitted to exceed a maximum length. Thus, instead of a single conductive structure extending along a direction of a device, there may be several conductive structures extending along the direction with spaces or discontinuities between the conductive structures. When viewing the layout of the conductive structures, these limited lengths may give the appearance of "cuts" or "breaks" in the conductive structures.

The term "cut" or "cut pattern" as used herein, may not refer to literally severing conductive structures into multiple conductive structures. Rather, cut may refer to the spaces or discontinuities between the conductive structures, and cut pattern may refer to the arrangement of cuts in the conductive structure, regardless of how those spaces or discontinuities were formed. For example, if a device is made by a damascene process, the conductive structures may be disposed in trenches disposed in dielectric material. In this example, the cuts may include the trench walls of the dielectric material separating the conductive structures. In another example, a conductive material may be deposited on a substrate to form the conductive structures and the cuts may include the spaces between the conductive structures where conductive material is removed or where no conductive material was deposited on the substrate. These are only two demonstrative examples and the conductive structures may be formed by other processes without departing from the scope of the disclosure.

FIG. 1 is an illustration of an example of the cuts in conductive structures in a semiconductor device 100. Semiconductor device 100 may include two wiring layers offset from one another in a Z-dimension, each of which includes conductive structures. One wiring layer 103 may include cut 102 along a Y-dimension, which limits the length of the conductive structures in the wiring layer. Another wiring layer 105 may include cuts 104 along an X-dimension, which limits the length of the conductive structures in that wiring layer. The X-dimension, Y-dimension, and Z-dimension are shown in coordinate system 101. In FIG. 1, the Z-dimension extends into and out of the page. The X, Y, and Z dimensions are orthogonal to one another. The coordinate system 101 may be oriented in any manner.

Box 108 provides an enlarged view of the wiring layer 103 in a vicinity of the cut 102. As shown in box 108, the wiring layer 103 may include conductive structures 110 extending along the X-dimension. The conductive structures 110 are discontinuous about cut 102. Cut 102 may extend perpendicular to a length of the conductive structures 110 (e.g., cut 102 extends in the Y-dimension). Box 106 provides an enlarged view of a different wiring layer in a vicinity of the cut 104. The wiring layer 105 may include conductive structures 112 extending in the Y-dimension. In the example shown in FIG. 1, the conductive structures 112 run perpendicularly to the conductive structures in 110. Similar to conductive structures 110, the conductive structures 112 are discontinuous around cut 104. Cut 104 may extend perpendicular to a length of the conductive structures 112 (e.g., cut 104 extends in the X-dimension). In order to provide a connection across the cuts 102, 104, the conductive structures 110, 112 may be coupled to conductive structures 112, 110 in another wiring layer, for example, by vias.

While the cuts in conductive structures, such as those shown in the example in FIG. 1, may reduce the risk of short circuits, the cuts may also limit the available routes and/or connection points (e.g., locations where two or more conductive structures may be coupled) across conductive structures within a layer and between multiple layers. These limited routes may cause an increase in impedance in the conductive structures.

The present disclosure is directed to layouts of conductive structures that may provide a greater number of available routes and/or connection points compared to existing layouts. The layouts according to principles of the present disclosure may allow for a reduction in impedance in the conductive structures compared to the impedance of conductive structures in existing layouts.

Figure 2:
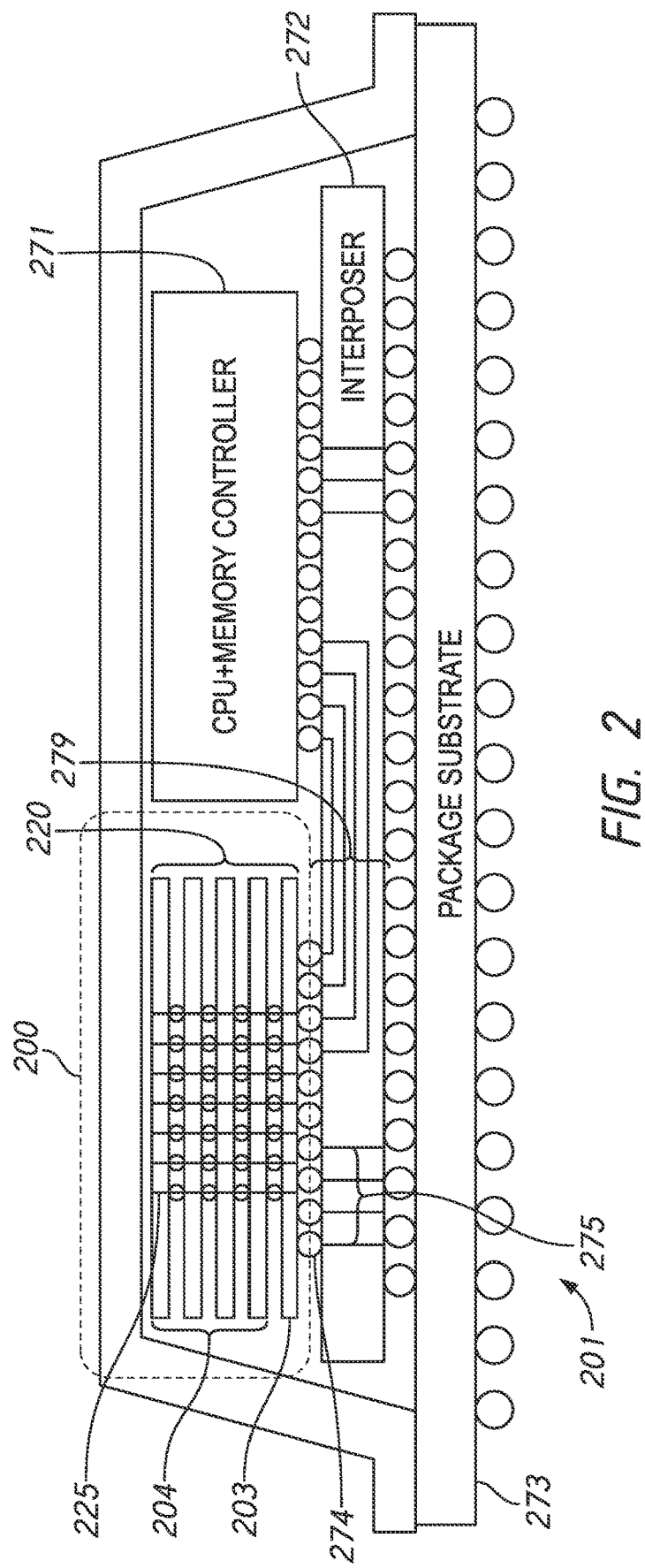
FIG. 2 is a schematic diagram of a semiconductor system including a semiconductor device that includes an interface chip and a plurality of core chips, in accordance with an embodiment of the present disclosure.

FIG. 2 is a schematic diagram of a semiconductor system including a semiconductor device that includes an interface chip and a plurality of core chips, in accordance with an embodiment of the present disclosure. For example, the semiconductor system 201 may include a semiconductor device 200, which may be a three-dimensional (3D) memory device, and further include a central processing unit (CPU) and memory controller 271, which may be a controller chip, on an interposer 272 on a package substrate 273. The interposer 272 may include one or more power lines 275 which supply power supply voltage from the package substrate 273. The interposer 272 includes a plurality of channels 279 that may interconnect the CPU and memory controller 271 and the semiconductor device 200.

The semiconductor device 200 may be a high bandwidth memory (HBM) in some embodiments. The semiconductor device 200 may include a plurality of chips (e.g., die) 220 including an interface (IF) chip 203 and core chips 204 stacked with each other. In this example, each core chip 204 may be a memory chip. Each of the core chips 204 may include a plurality of memory cells, which may be arranged in a memory array. The core chips 204 may further include circuitry for accessing the memory cells. In some examples, the memory cells may be DRAM memory cells. The IF chip 203 may include circuitry for accessing the memory cells on the core chips 204 for memory operations. For example, the IF chip 203 may include a command/address input circuit for receiving commands and addresses from the memory controller 271. In some examples, the IF chip 203 may include an internal clock generator for providing clock signals to the core chips 204 and/or other components of the IF chip 203. In some examples, the IF chip 203 may include an internal voltage generator for receiving external voltages (e.g., VSS, VDD) from power lines 275 and providing various internal voltages to the core chips 204 and/or other components of the IF chip 203. In some examples, the various components of the core chips 204 and/or IF chip 203 may include and/or be coupled by one or more conductive structures according to embodiments of the present disclosure. For example, the internal voltage generator may be coupled to external voltage sources by one or more conductive structures. In another example, conductive structures according to embodiments of the present disclosure may be used for providing clock signals within IF chip 203 and/or core chips 204 and/or between IF chip 203 and core chips 204.

The semiconductor device 200 may include conductive through silicon vias (TSVs) 225 (e.g., through substrate electrodes) which couple the IF chip 203 and core chips 204 by penetrating the IF chip 203 and core chips 204. The IF chip 203 may be coupled to the interposer 272 via interconnects, such as bumps 274. For example, the bumps 274 may be microbumps having bump pitches of less than about or less than one hundred micro meters and exposed on an outside of the IF chip 203. A portion of the bumps 274 may be coupled to the one or more power lines 275. Another portion of the bumps 274 may be coupled to the plurality of channels 279.

While the examples provided herein may relate to HBM, specifically conductive structures for providing voltages from power supplies (e.g., voltage generators either internal or external), the embodiments of the present disclosure are not limited to this application. That is, conductive structures and layouts as described herein may be provided in other memory types (e.g., DDR, LPDDR), other semiconductor devices (e.g., memory controllers, CPUs), and/or perform different functions (e.g., signal lines).

Figure 3:
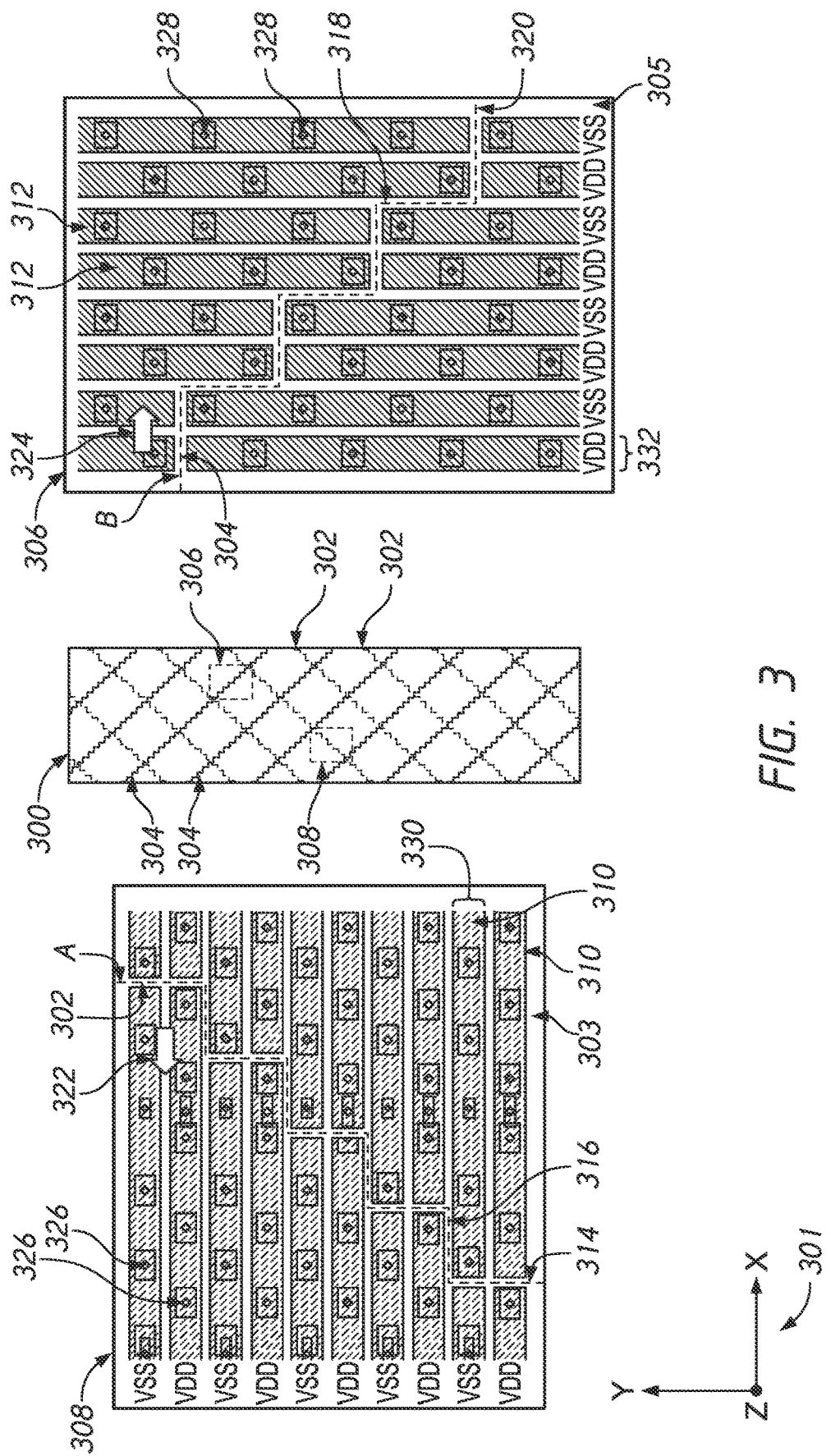
FIG. 3 is an illustration of conductive structures in a semiconductor device according to an embodiment of the present disclosure.

FIG. 3 is an illustration of conductive structures in a semiconductor device 300 according to an embodiment of the present disclosure. In some embodiments, semiconductor device 300 may be included in semiconductor device 200, for example, in IF chip 203. In some embodiments, semiconductor device 300 may include two wiring layers 303, 305. In some embodiments, the two wiring layers 303, 305 may be parallel to one another and may be offset from one another in a Z-dimension. One wiring layer 303 may include conductive structures 310 and the other wiring layer 305 may include conductive structures 312. The conductive structures 310 in wiring layer 303 may be in rows 330 and extend in an X-dimension orthogonal to the conductive structures 312. The conductive structures 312 may be in columns 332 and extend in a Y-dimension in wiring layer 305 in some embodiments. The X-dimension, Y-dimension, and Z-dimension are shown in coordinate system 301. In FIG. 3, the Z-dimension extends into and out of the page. The X, Y, and Z dimensions are orthogonal to one another. The coordinate system 301 may have any orientation.

Wiring layer 303 may include cuts 314 according to cut patterns 302, which may limit the length of the conductive structures 310 in the wiring layer 303. Wiring layer 305 may include cuts 330 according to cut patterns 304, which may limit the length of the conductive structures 312 in wiring layer 303. In some embodiments, such as the one shown in FIG. 3, cut patterns 302 may be orthogonal to cut patterns 304. Although only two wiring layers 303, 305 are shown in FIG. 3, semiconductor device 300 may include additional wiring layers in some embodiments. The additional wiring layers may be offset from the wiring layers 303 and 305 in the Z-dimension. For the example, the additional wiring layers may be above, below, and/or interposed between the wiring layers 303, 305.

Box 308 provides an enlarged view of wiring layer 303 in a vicinity of one of the cut patterns 302. The wiring layer 303 may include conductive structures 310, which are discontinuous about cut pattern 302. For easier viewing, cut pattern 302 is highlighted by a dashed line. Unlike cut 102 shown in FIG. 1, which consists of a cut in a single straight line, cuts 314 arranged along cut pattern 302 are arranged in a "stair-step" pattern. The cuts 314 extend along the Y-dimension (e.g., across the conductive structures 310) and are offset from one another (e.g., from the adjacent or next cut) by distances 316 extending in the X-dimension (e.g., along the conductive structures 310). Thus, unlike cut 102 in FIG. 1, the cuts 314 are not aligned along a single line extending in one dimension (e.g., the Y-dimension).

Each cut 314 may extend for a length sufficient to "cut" a number of conductive structures 310. In the example shown in FIG. 3, the cuts 314 extend across two conductive structures 310. That is, each cut 314 "cuts" two adjacent structures 310. For each cut pattern 302, a row 330 of conductive structures 310 may only be "cut" by one cut 314 of the corresponding cut pattern 302. When overlapped with the wiring layer 305, each distance 316 may extend across a number of conductive structures 312 in wiring layer 305. In the example shown in FIG. 3, each distance 316 extends across two conductive structures 312.

Box 306 provides an enlarged view of wiring layer 305 in a vicinity of a cut pattern 304. The wiring layer 305 may include conductive structures 312, which are discontinuous about cut pattern 304. For easier viewing, cut pattern 304 is highlighted by a dashed line. Similar to cut pattern 302, cut pattern 304 is a "stair-step" pattern. Cuts 320 arranged in cut pattern 304 extend in the X-dimension (e.g., across the conductive structures 312) and are offset from one another in by distances 318 extending along a Y-dimension (e.g., along the conductive structures 312). Thus, the cuts 320 are not aligned along a single line extending in one dimension (e.g., the X-dimension) in contrast to cut 104 shown in FIG. 1.

When overlapped with the wiring layer 303, each distance 318 may extend across a number of conductive structures 310 in wiring layer 303. In FIG. 3, the distances 318 extend across two conductive structures 310. Each cut 320 may extend across a number of conductive structures 312. In the example shown in FIG. 3, the cuts 320 extend across two conductive structures 312. The cuts 320 may not overlap in some embodiments. That is, for each cut pattern 304, a column 332 of conductive structures 312 may only be "cut" by one cut 320 of the corresponding cut pattern 304.

As mentioned previously, the stair-step patterns of cut patterns 302 and cut patterns 304 are orthogonal to one another. The cuts 314 arranged in cut pattern 302 extend in a dimension (e.g., Y-dimension) orthogonal to the dimension (e.g., Z-dimension) the cuts 320 arranged in cut pattern 304 extend. As shown in FIG. 3, starting at point A of cut pattern 302, each distance 316 extends in a direction along the X-dimension indicated by arrow 322. Similarly, starting at point B of cut pattern 304, each cut 320 extends in a direction along the X-dimension indicated by arrow 324. As shown in FIG. 3, the direction indicated by arrow 322 is opposite of the direction indicated by arrow 324, which results in the orthogonal stair-step patterns of cut patterns 302 and 304.

The conductive structures 310 and 312 may be used to perform different functions. For example, in some embodiments of the disclosure, conductive structures 310 and 312 are power supply wires coupled to power supplies VSS, VDD and provide power to circuits. In some embodiments, the number of conductive structures over which the various cut pattern portions extend may be based, at least in part, on a number of power supplies. For example, where there are two power supplies (e.g., VSS and VDD), cut portions 314 may extend across two conductive structures 310, as previously described for the example shown in FIG. 3. In another example (not shown in FIG. 3), if there were three power supplies (e.g., VSS, VDD1, VDD2), cut portions 314 may extend across three conductive structures 310. The cuts 320 and distances 316, 318 arranged in cut patterns 302 and 304 may also extend across three conductive structures accordingly. However, the disclosure is not limited to the example of power supply wires and/or cut length related to a number of power supplies. For example, the conductive structures 310, 312 may be signal lines providing signals from one or more signal sources. In this example, in some embodiments, the various portions of the cuts may extend across a number of conductive structures equal to a number of signal sources.

In some embodiments, conductive structures 310 may be coupled to corresponding conductive structures 312, for example, to provide power to one or more components (not shown) of device 300. In some embodiments, conductive structures 310 and conductive structures 312 may be coupled to one another by vias 326, 328, which may extend in the Z-dimension between and/or through the wiring layers 303, 305. In some embodiments, conductive structures 310 and/or conductive structures 312 may additionally or alternatively be coupled to conductive structures in other wiring layers (not shown). In some embodiments, the conductive structures 310, 312 may include a metallic material such as copper, tungsten, and/or an alloy of multiple metallic materials. In some embodiments, the vias 326, 328 may include a conductive material, which may be a metallic material in some embodiments. In some embodiments, the wiring layers 303, 305 may include a dielectric material in which the conductive structures 310, 312 are disposed. In some embodiments, wiring layers 303, 305 may be fabricated using a damascene process.

The layout of the conductive structures and/or cuts in the conductive structures may limit the length of conductive structures, which may reduce the risk of short circuits in some embodiments. Furthermore, in some embodiments, the layout of the conductive structures according to principles of the present disclosure may reduce impedance of the conductive structures.

Figure 4A:
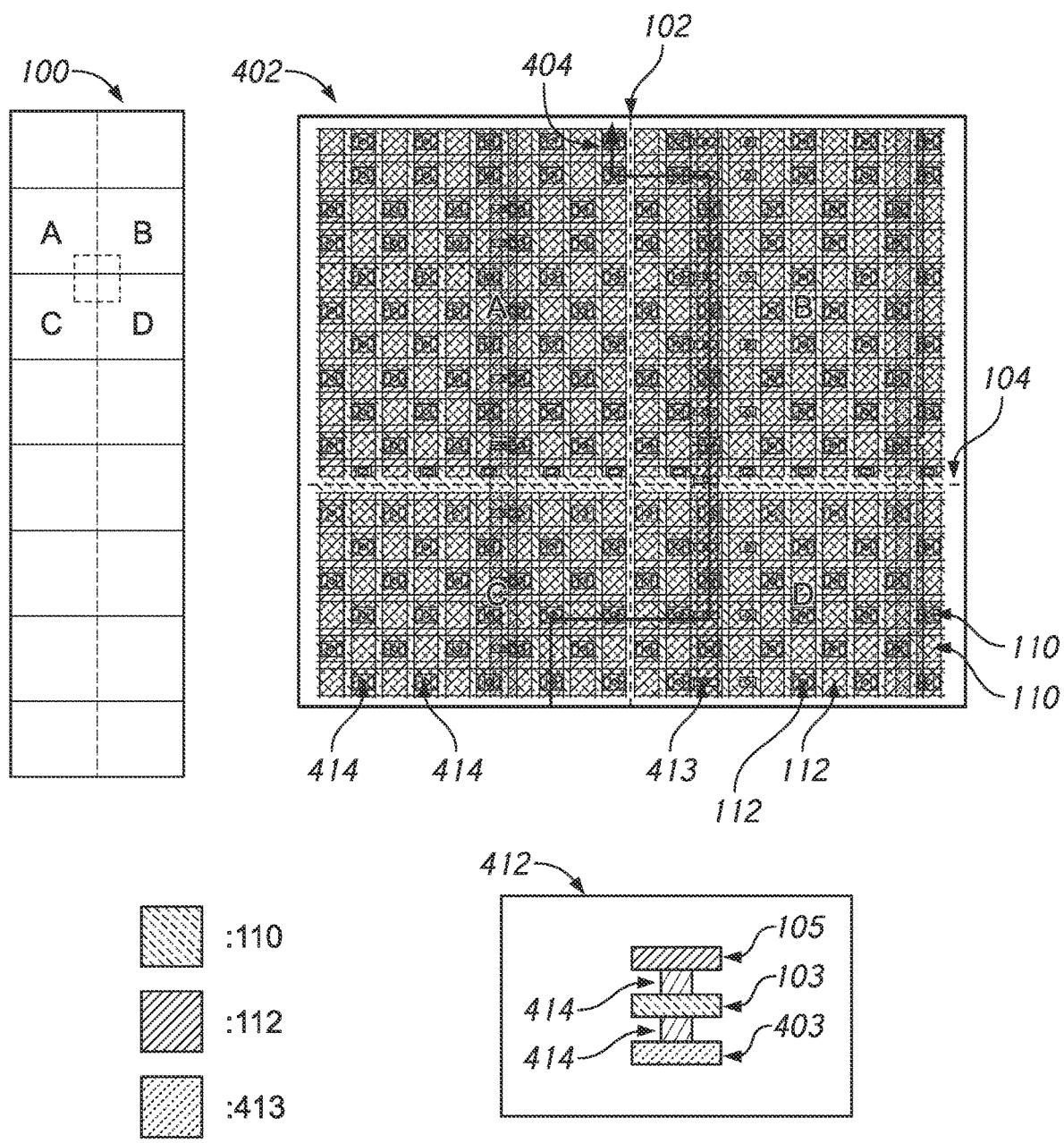
FIG. 4A is an illustration the conductive structures shown in FIG. 1.
Figure 4B:
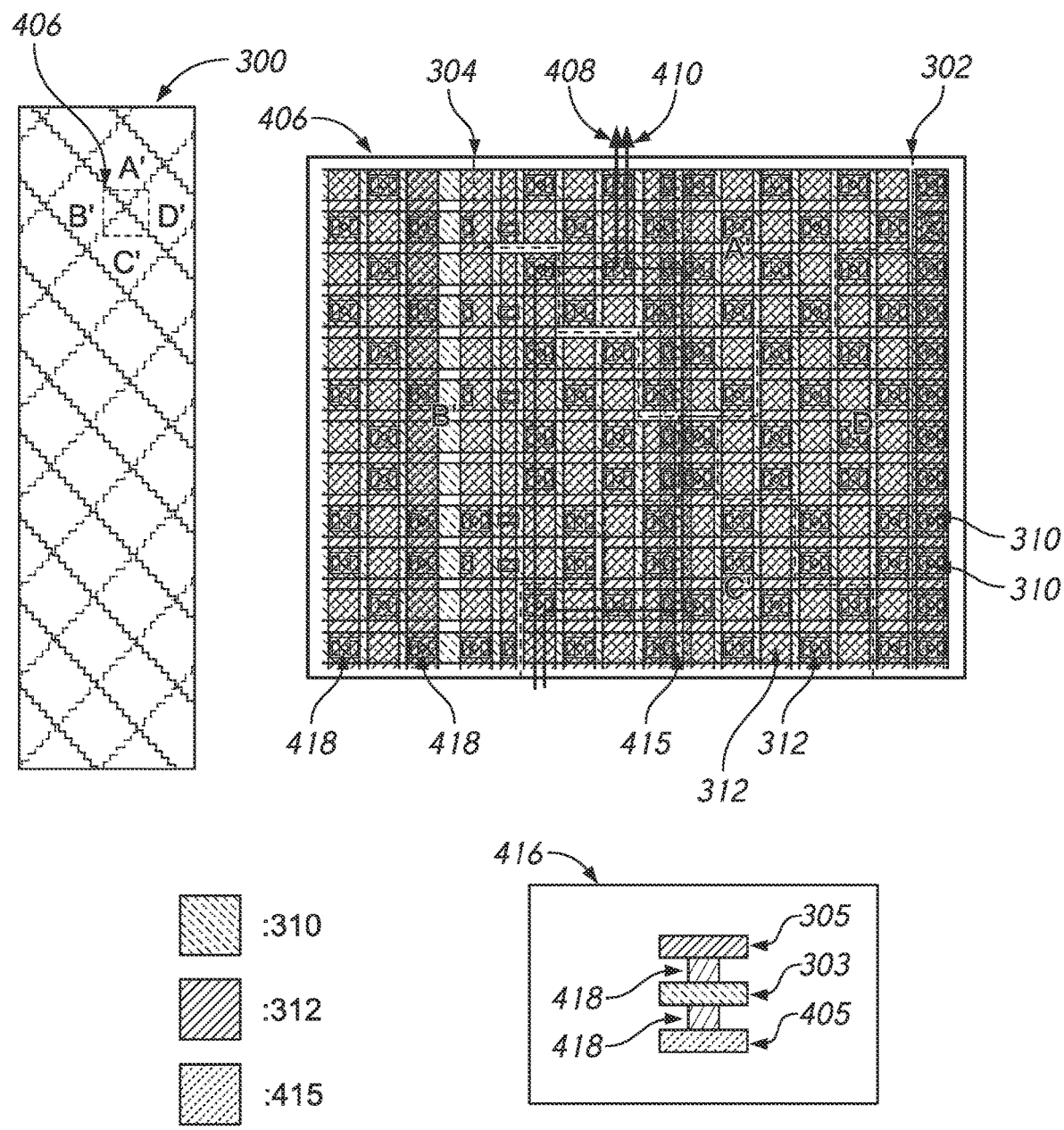
FIG. 4B is an illustration of the conductive structures shown in FIG. 3.

FIG. 4A is an illustration of the conductive structures shown in FIG. 1 and FIG. 4B is an illustration of the conductive structures shown in FIG. 3.

With reference to FIG. 4A, box 402 is an enlarged view of a portion of device 100 in a vicinity where cuts 102 and cuts 104 coincide. A partial cross-sectional view of device 100 is shown in box 412. The wiring layers 103 and 105 are shown stacked in the Z-dimension along with a third wiring layer 403, which includes conductive structures 413. The wiring layers 103, 105, and/or 403 may be coupled by vias 414. Although wiring layer 103 is shown as disposed between wiring layer 105 and wiring layer 403 in FIG. 4A, in some embodiments, the order of the wiring layers may be different in other embodiments.

As shown in box 402, the intersection of cuts 102 and 104 divide the region around the intersection into four quadrants A, B, C, D. Due to cuts 102 and 104, to provide a conductive path from quadrant C to quadrant A, the conductive path 404 must extend into quadrant D in order to couple to conductive structure 413 in order to "jump" across cut 104. The conductive path 404 may then extend from quadrant D to quadrant B where it can then return to wiring layers 103, 105 to reach quadrant A. Thus, the cut pattern in device 100 requires a circuitous path and/or has limited coupling between the conductive layers 103, 105. This may increase resistance of the conductive structures 110, 112 along the path 404. Furthermore, extending into a third layer (e.g., wiring layer 403) may also increase impedance.

With reference to FIG. 4B, box 406 is an enlarged view of a portion of device 300 in a vicinity where cut pattern 302 and cut pattern 304 coincide. A partial cross-sectional view of device 300 is shown in box 416. The wiring layers 303 and 305 are shown stacked in the Z-dimension along with a third wiring layer 405, which includes conductive structures 415. The wiring layers 303, 305, and/or 405 may be coupled by vias 418. Although the wiring layer 303 is shown as disposed between wiring layer 305 and wiring layer 405 in FIG. 4B, in some embodiments, the order of the wiring layers may be different in other embodiments.

As shown in box 406, the cuts arranged in cut patterns 302 and 304 divide the region around the intersection into four quadrants A', B', C', D'. In order to form a conductive path 408 from quadrant C' to A', the conductive path 408 may stay between wiring layers 303 and 305. Furthermore, the conductive path 408 may take a more direct route through quadrant B' to quadrant A' in comparison to conductive path 404. This may reduce the path length of conductive path 408 and/or increase the density of conductive couplings between the wiring layers 303 and 305 along the conductive path 408 in some embodiments. In some embodiments, this may reduce the impedance of the conductive structures 310 and 312 along the conductive path 408. Furthermore, conductive path 408 does not need to extend into wiring layer 405, which may also reduce impedance.

In some embodiments, conductive path 410 may also be used to couple quadrants A' and C'. Conductive path 410 may couple to conductive structure 415 to "jump" across where cuts 304 and 302 intersect. In some embodiments, conductive path 410 may be used in combination with conductive path 408, which may further increase a number of couplings between conductive structures and reduce impedance.

Although the examples provided in FIGS. 3, 4A, and 4B show two wiring layers with cuts arranged in cut patterns in both wiring layers, in some embodiments, only conductive structures of a single wiring layer may include cuts. In some embodiments, the device may include a single wiring layer including cuts. For example, a wiring layer may include conductive structures including cuts according to a cut pattern. In some embodiments, the wiring layer may be formed by a damascene process. In some examples, a second wiring layer may also be included with the first wiring layer. The second wiring layer may include conductive structures without cuts or may have cuts according to another cut pattern.

Conductive structures with cuts according to principles of the present disclosure may be included in one or more layers (e.g., wiring layers) of a semiconductor device. For example, a set of conductive structures (e.g., conductive structures 310) may be included in a metallization layer (e.g., metal 2 layer) and another set of conductive structures (e.g., conductive structures 312) may be included in another metallization layer (e.g., metal 3 layer). However, the conductive structures with cuts according to principles of the present disclosure may be provided in layouts that also include conductive structures in the same layer that may not include cuts according to principles of the present disclosure.

Figure 5:
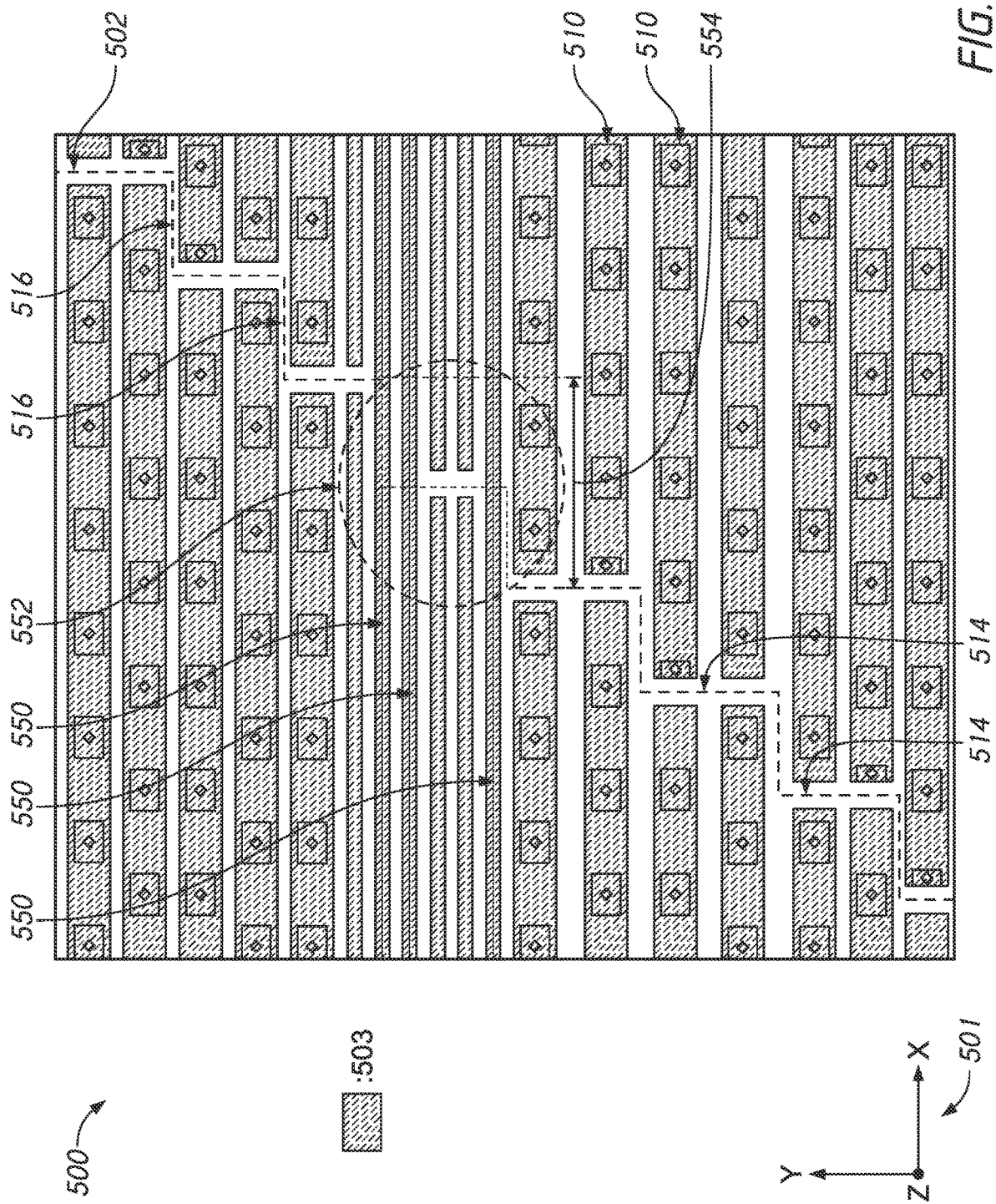
FIG. 5 is a wiring diagram for a wiring layer for a portion of a semiconductor device according to an embodiment of the present disclosure.

FIG. 5 is a wiring diagram for a wiring layer 503 for a portion of a semiconductor device 500 according to an embodiment of the present disclosure. In some embodiments, semiconductor device 300 may be included in semiconductor device 500. In some embodiments, semiconductor device 500 may be included in semiconductor device 200, for example, in IF chip 203. The X-dimension, Y-dimension, and Z-dimension are shown in coordinate system 501. The Z-dimension extends into and out of the page. The X, Y, and Z dimensions are orthogonal to one another. The coordinate system 501 may be oriented in any manner.

Wiring layer 503 may include a variety of conductive structures, some of which may include cuts according to a cut pattern and some that do not. For example, conductive structures 510 may include cuts according to a cut pattern and conductive structures 550 may not include cuts according to the cut pattern. Both conductive structures 510 and conductive structures 550 may extend in the X-dimension. The conductive structures 510 may be cut according to a cut pattern 502, indicated by a dashed line for easier viewing. Cuts 514 may be arranged in cut pattern 502. Cuts 514 may extend in the Y-dimension, each offset from one another in the X-dimension by a distance 516. In some embodiments, cut pattern 502 may be similar to cut pattern 302 shown in FIG. 3. However, the conductive structures 550 may be cut by cuts 514 arranged according to cut pattern 502. For example, the region indicated by circle 552 may include conductive structures 550 that do not have cuts 514. In order to maintain the pattern of the cuts 514 in the power lines 510, the cuts 514 on either side of the region indicated by circle 552 may be offset from one another in the X-dimension. For example, the cuts 514 may be offset by a distance 554 equal to a number of distances 516 that would have been between the cuts 514 on either side of the region indicated by circle 552 had the cut pattern 502 continued completely through the region indicated by circle 552. In the example shown in FIG. 5, distance 554 is equal to two distances 516. In some embodiments, the length of distance 554 may be based, at least in part, on how far the region indicated by circle 552 extends in the Y-dimension.

Figure 6:
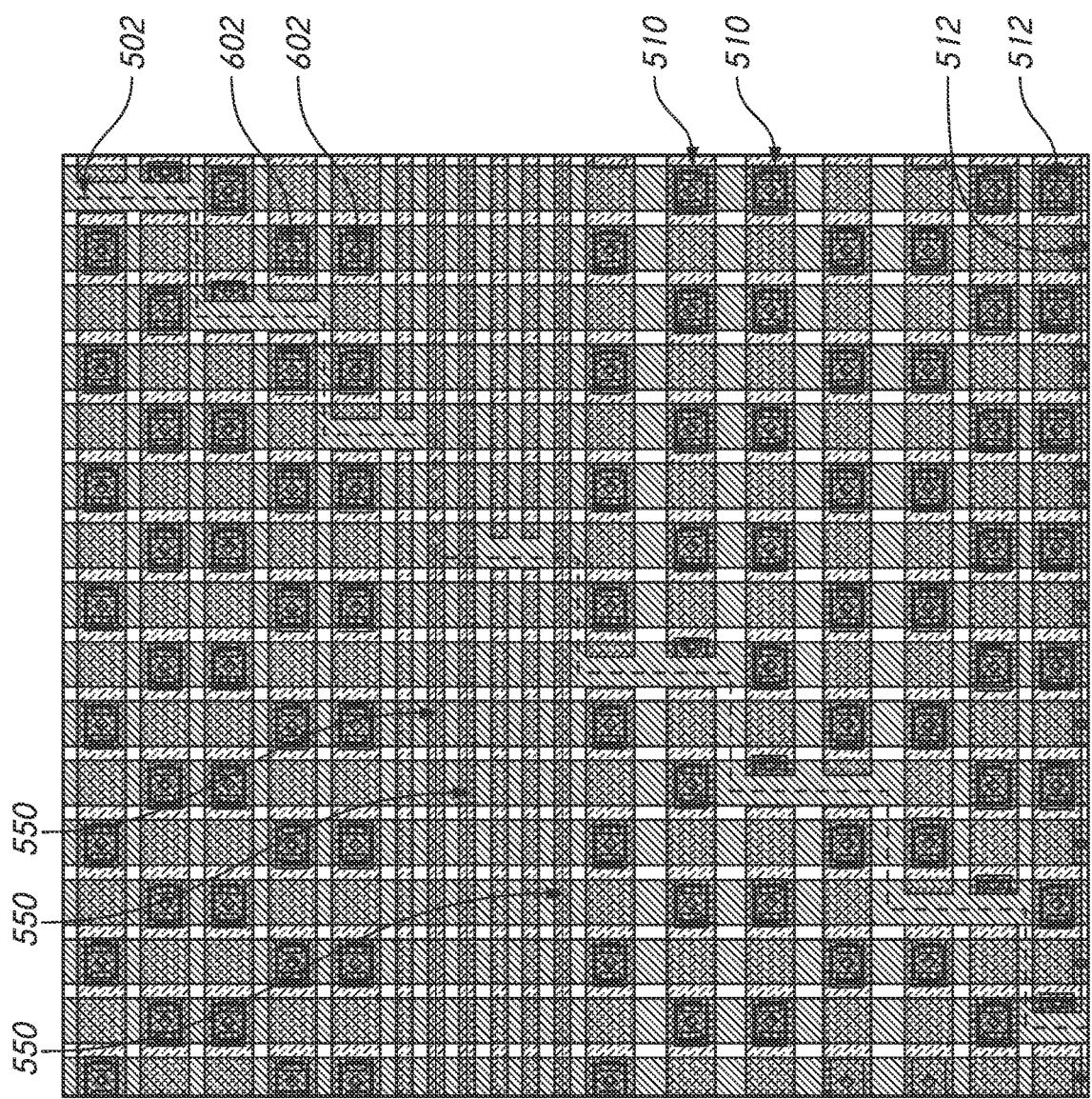
FIG. 6 is a wiring diagram for two wiring layers for the portion of the semiconductor device shown in FIG. 5.

FIG. 6 is a wiring diagram for wiring layer 503 and wiring layer 505 for the portion of the semiconductor device 500 shown in FIG. 5 according to an embodiment of the disclosure. Wiring layer 505 may be spaced from wiring layer 503 in the Z-dimension. Wiring layer 505 may include conductive structures, for example, conductive structures 512. The conductive structures 510 of wiring layer 503 may be coupled to the conductive structures 512 of wiring layer 505 by vias 602. In some embodiments, conductive structures 510 may be power lines and conductive structures 550 may be signal lines. However, the conductive structures 510, 550 may serve different purposes in other embodiments.

Figure 7:
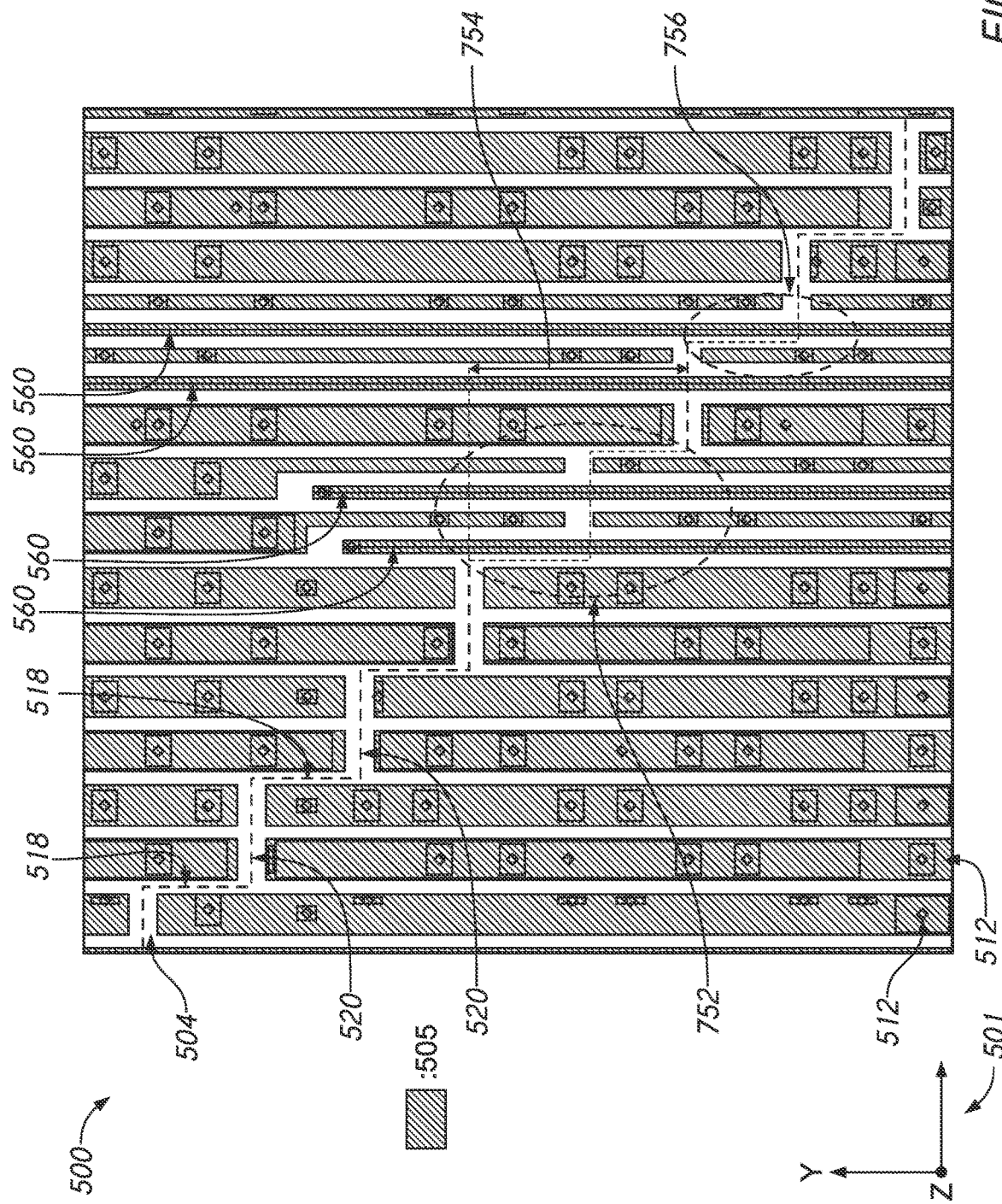
FIG. 7 is a wiring diagram for a wiring layer for another portion of the semiconductor device according to an embodiment of the present disclosure

FIG. 7 is a wiring diagram for wiring layer 503 for another portion of the semiconductor device 500 according to an embodiment of the present disclosure. Wiring layer 505 may include a variety of conductive structures, for example, conductive structures 512 and conductive structures 560. Both conductive structures 512 and conductive structures 560 may extend in the Y-dimension. The conductive structures 512 may be cut by cuts arranged in a cut pattern 504, indicated by a dashed line for easier viewing. Cuts 520 arranged in cut pattern 504 may extend in the X-dimension, each offset from one another in the Y-dimension by a distance 518. In some embodiments, cut pattern 504 may be similar to cut pattern 304 shown in FIG. 3. However, the conductive structures 560 may not be cut arranged according to cut pattern 504. Thus, in the region indicated by circle 752, there may be no cuts 520. In order to maintain the pattern of the cuts 520 in the conductive structures 512, the cuts 520 on either side of the region indicated by circle 752 may be offset from one another in the Y-dimension. For example, the cuts 520 may be offset by a distance 754 equal to a number of distances 518 that would have been between the cuts 520 on either side of the region indicated by circle 752 had the cuts 504 continued through the region indicated by circle 752. In the example shown in FIG. 7, distance 754 is equal to two distances 518. In some embodiments, the length of distance 754 may be based, at least in part, on how far the region indicated by circle 852 extends in the X-dimension.

In some embodiments, there may be multiple regions in the wiring layer where the there are no cuts according to the cut pattern or cuts do not extend a length of other cuts arranged in the cut pattern in order to accommodate other conductive structures. In the example shown in FIG. 7, a conductive structure 512 is disposed between two regions of conductive structures 560 indicated by circles 752 and 756.

Figure 8:
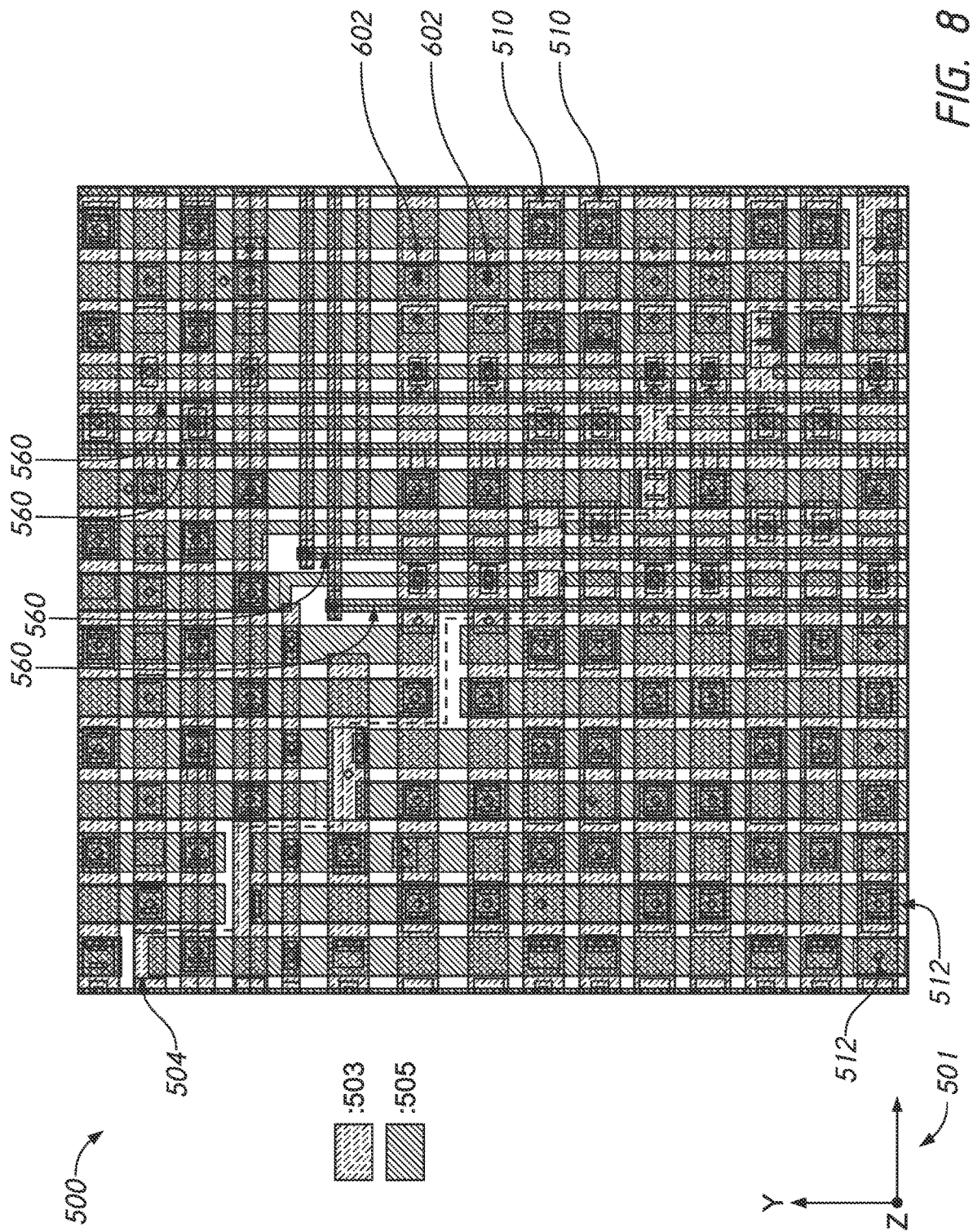
FIG. 8 is a wiring diagram for two wiring layers for the portion of the semiconductor device shown in FIG. 7.

FIG. 8 is a wiring diagram for wiring layer 503 and wiring layer 505 for the portion of the semiconductor device 500 shown in FIG. 7 according to an embodiment of the disclosure. Again, the conductive structures 510 of wiring layer 503 may be coupled to the conductive structures 512 of wiring layer 505 by vias 602. In some embodiments, conductive structures 512 may be power lines and conductive structures 560 may be signal lines. However, the conductive structures 512, 560 may serve different purposes in other embodiments.

Despite the "interruptions" in the cut pattern 504 through the conductive structures 560, and cut pattern 502 through conductive structures 550, the coupling advantages described in reference to FIG. 4 for coupling conductive structures 510 and 512 provided by cut patterns 502 and 504 may be maintained.

As demonstrated in FIGS. 5-8, the cut pattern (e.g., layout of cuts/cut portions) need not be applied to all of the conductive structures in a wiring layer. This may allow for flexibility, for example, when some conductive structures have different maximum permitted distances and/or require cuts in different locations due to the location of components on the semiconductor device.

In some embodiments, the layouts of cuts in conductive structures described herein may provide shorter routes, a greater number of available routes, and/or connection points compared to existing layouts of cuts in conductive structures. In some embodiments, the layouts according to principles of the present disclosure may allow for a reduction in impedance in the conductive structures compared to the impedance of conductive structures in existing layouts. In some embodiments, the layouts of cuts in conductive structures need not be applied to all of the conductive structures in a wiring layer.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative and should not be construed as limiting the appended claims to any particular embodiment or group of embodiments. Thus, while various embodiments of the disclosure have been described in particular detail, it should also be appreciated that numerous modifications and alternative embodiments may be devised by those having ordinary skill in the art without departing from the broader and intended spirit and scope of the present disclosure as set forth in the claims that follow. Accordingly, the specification and drawings are to be regarded in an illustrative manner and are not intended to limit the scope of the appended claims.

What is claimed is:

1. An apparatus comprising:
 a plurality of core chips, each of the core chips including a memory array; and
 an interface chip coupled to the plurality of core chips, wherein the interface chip is configured to provide signals to the plurality of core chips for performing memory operations, wherein the interface chip comprises:
  a first plurality of conductive structures extending in a first dimension;
  a first cut pattern including a first plurality of cuts, the first plurality of cuts disposed between ones of the first plurality of conductive structures, wherein the first plurality of cuts extends in a second dimension orthogonal to the first dimension;
  a second plurality of conductive structures extending in the second dimension, wherein the second plurality of conductive structures are offset from the first plurality of conductive structures in a third dimension; and
  a second cut pattern including a second plurality of cuts, the second plurality of cuts orthogonal to the first plurality of cuts of the first cut pattern, wherein the second plurality of cuts is disposed between ones of the second plurality of conductive structures, wherein the second plurality of cuts extend in the first dimension.

2. The apparatus of claim 1, wherein the interface chip further comprises an internal voltage generator and the first plurality of conductive structures and the second plurality of conductive structures are coupled to the internal voltage generator.

3. The apparatus of claim 1, wherein the first plurality of conductive structures is arranged in a plurality of rows, wherein each of the first plurality of cuts is disposed in a number of rows of the plurality of rows, and wherein each of the first plurality of cuts is offset from one another in the first dimension by a first distance, wherein the number of rows is based, at least in part, on a number of voltages provided to the interface chip.

4. The apparatus of claim 3, wherein the second plurality of conductive structures is arranged in a plurality of columns, wherein each of the second plurality of cuts is disposed in a number of columns of the plurality of columns, and wherein each of the second plurality of cuts is offset from one another in the second dimension by a second distance, wherein the number of columns is based, at least in part, on the number of voltages provided to the interface chip.

5. The apparatus of claim 4, wherein the first distance extends a number of conductive structures of the second plurality of conductive structures and the second distance extends a number of conductive structures of the first plurality of conductive structures.

6. The apparatus of claim 1, comprising a high bandwidth memory including the plurality of core chips and the interface chip.

7. An apparatus comprising:
a plurality of core chips, each of the core chips including a memory array; and
an interface chip coupled to the plurality of core chips, wherein at least one of the interface chip or one of the plurality of core chips comprises:
a first plurality of conductive structures extending in a first dimension;
a first cut pattern including a first plurality of cuts, the first plurality of cuts disposed between ones of the first plurality of conductive structures, wherein the first plurality of cuts extends in a second dimension orthogonal to the first dimension;
a second plurality of conductive structures extending in the first dimension, wherein ones of the first plurality of cuts are not disposed between ones of the second plurality of conductive structures;
a third plurality of conductive structures extending in the second dimension, wherein the third plurality of conductive structures are offset from the first plurality of conductive structures and the second plurality of conductive structures in a third dimension;
a second cut pattern including a second plurality of cuts, the second plurality of cuts orthogonal to the first plurality of cuts of the first cut pattern, wherein the second plurality of cuts is disposed between ones of the third plurality of conductive structures, wherein the second plurality of cuts extend in the first dimension; and
a fourth plurality of conductive structures extending in the second dimension, wherein ones of the second plurality of cuts are not disposed between ones of the fourth plurality of conductive structures.

8. The apparatus of claim 7, wherein the first plurality of conductive structures and the second plurality of conductive structures are located in a first wiring layer.

9. The apparatus of claim 7, wherein the first plurality of conductive structures comprise power lines and the second plurality of structures comprise signal lines.

10. The apparatus of claim 7, wherein the third plurality of conductive structures and the fourth plurality of conductive structures are located in a second wiring layer.

11. The apparatus of claim 7, wherein at least one of the first plurality of conductive structures is coupled to at least one of the third plurality of conductive structures by at least one via.

12. The apparatus of claim 7, wherein at least one of the first plurality of cuts comprises a trench wall.

13. An apparatus comprising:
a plurality of core chips, each of the core chips including a memory array; and
an interface chip coupled to the plurality of core chips wherein at least one of the interface chip or one of the plurality of core chips comprises:
a first plurality of conductive structures extending in a first dimension;
a second plurality of conductive structures extending in a second dimension orthogonal to the first dimension;
a first cut pattern including a first plurality of cuts, the first plurality of cuts disposed between ones of the first plurality of conductive structures; and
a second cut pattern including a second plurality of cuts, the second plurality of cuts disposed between ones of the second plurality of conductive structures, wherein the second cut pattern is orthogonal to the first cut pattern.

14. The apparatus of claim 13, wherein each of the first plurality of cuts is disposed in at least one row of the plurality of rows, and wherein each of the first plurality of cuts is offset from one another in the first dimension by a first distance and each of the second plurality of cuts is offset from one another in the second dimension by a second distance.

15. The apparatus of claim 14, wherein the first distance and the second distance are equal.

16. The apparatus of claim 13, wherein the first plurality of conductive structures is arranged in a plurality of rows and each of the first plurality of cuts is disposed in at least one row of the plurality of rows.

17. The apparatus of claim 16, further comprising one or more power supplies coupled to one or more of the first plurality of conductive structures, wherein a number of rows in which the first plurality of cuts is disposed is based, at least in part, on a number of power supplies.

18. The apparatus of claim 13, wherein the second plurality of conductive structures is arranged in a plurality of columns and each of the second plurality of cuts is disposed in at least one column of the plurality of columns, and
wherein the apparatus further comprises one or more power supplies and a number of columns in which the second plurality of cuts is disposed is based, at least in part, on a number of power supplies.

* * * * *